United States Patent
Assefa et al.

(10) Patent No.: US 7,902,620 B2
(45) Date of Patent: Mar. 8, 2011

(54) SUSPENDED GERMANIUM PHOTODETECTOR FOR SILICON WAVEGUIDE

(75) Inventors: Solomon Assefa, Ossining, NY (US); Jack O. Chu, Manhasset Hills, NY (US); Martin M. Frank, Dobbs Ferry, NY (US); William M. Green, Astoria, NY (US); Young-hee Kim, Mohegan Lake, NY (US); George G. Totir, Danbury, CT (US); Joris Van Campenhout, Grimbergen (BE); Yurii A. Vlasov, Katonah, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 12/191,687

(22) Filed: Aug. 14, 2008

(65) Prior Publication Data
US 2010/0038736 A1     Feb. 18, 2010

(51) Int. Cl.
*H01L 31/18* (2006.01)

(52) U.S. Cl. ......... 257/432; 257/184; 257/458; 257/616; 257/656; 257/E31.012; 257/E31.024; 257/E31.061

(58) Field of Classification Search .................. 257/184, 257/432, 458, 616, 656
See application file for complete search history.

(56) References Cited

U.S. PATENT DOCUMENTS

| | | | | |
|---|---|---|---|---|
| 5,559,912 A | * | 9/1996 | Agahi et al. | 385/42 |
| 5,796,118 A | * | 8/1998 | Morikawa et al. | 257/19 |
| 6,330,378 B1 | * | 12/2001 | Forrest et al. | 385/14 |
| 6,897,498 B2 | * | 5/2005 | Gothoskar et al. | 257/226 |
| 7,095,006 B2 | | 8/2006 | Yang | |
| 7,262,117 B1 | | 8/2007 | Gunn, III et al. | |
| 7,266,263 B2 | | 9/2007 | Ahn et al. | |
| 2004/0188794 A1 | | 9/2004 | Gothoskar et al. | |
| 2007/0104411 A1 | * | 5/2007 | Ahn et al. | 385/14 |
| 2010/0213561 A1 | * | 8/2010 | Assefa et al. | 257/432 |

OTHER PUBLICATIONS

Yin et al., "40Gb/s Ge-on-SOI waveguide photodetectors by selective Ge growth", OFC/NFOEC 2008, Intel Corporation.

* cited by examiner

*Primary Examiner* — A. Sefer
(74) *Attorney, Agent, or Firm* — Scully, Scott, Murphy & Presser, P.C.; Vazken Alexanian

(57) ABSTRACT

A vertical stack of a first silicon germanium alloy layer, a second epitaxial silicon layer, a second silicon germanium layer, and a germanium layer are formed epitaxially on a top surface of a first epitaxial silicon layer. The second epitaxial silicon layer, the second silicon germanium layer, and the germanium layer are patterned and encapsulated by a dielectric cap portion, a dielectric spacer, and the first silicon germanium layer. The silicon germanium layer is removed between the first and second silicon layers to form a silicon germanium mesa structure that structurally support an overhanging structure comprising a stack of a silicon portion, a silicon germanium alloy portion, a germanium photodetector, and a dielectric cap portion. The germanium photodetector is suspended by the silicon germanium mesa structure and does not abut a silicon waveguide. Germanium diffusion into the silicon waveguide and defect density in the germanium detector are minimized.

13 Claims, 8 Drawing Sheets

SUSPENDED GERMANIUM PHOTODETECTOR FOR SILICON WAVEGUIDE

FIELD OF THE INVENTION

The present invention relates to a semiconductor structure, and particularly to a germanium photodetector for a silicon waveguide, and methods of manufacturing the same.

BACKGROUND OF THE INVENTION

Germanium photodetectors may be employed in microphotonic devices for the high efficiency of photon absorption. Integration of a high quantum efficiency germanium photodetector into a silicon base semiconductor substrate faces a challenge because of the differences in material property in silicon and germanium.

For example, Yin at al., "40 Gb/s Ge-on-SOI waveguide photodetectors by selective Ge growth," Optical Fiber Communication/National Fiber Optic Engineers Conference, pp. 1-3, February, 2008, Digital Object Identifier 10.1109/OFC.2008.4528025 discloses a silicon waveguide to which a Ge photodetector is attached. While the Ge photodetector in Yin provides an enhanced quantum efficiency over previous Ge photodetectors, the performance of the Ge photodetector is limited by alloying of the germanium material with the silicon material in the waveguide because germanium atoms have a high diffusivity in silicon. Since the photons in the silicon waveguide may be scattered or reflected even by small crystalline defects or impurities, such a direct contact between the silicon material in the waveguide and the germanium material in the photodetector has an adverse impact on the quantum efficiency. The wider the area of the contact between the silicon waveguide, the greater the amount of germanium atoms that diffuse into the silicon waveguide.

Further, silicon has a lattice constant of 0.543095 nm and germanium has a lattice constant of 0.564613 nm at 300 K. The resulting lattice mismatch of about 4% introduces severe strain on a germanium material when the germanium material is grown epitaxially on a silicon material. Such a strain in the epitaxially grown germanium generates crystalline defects, which generates a significant amount of dark current in the germanium photodetector. The dark current is the electrical current that a photodetector generates in the absence of any signal, i.e., in the absence of any light signal in the silicon waveguide. A high dark current makes distinction between presence and absence of light signal in the silicon waveguide difficult.

In view of the above, there exists a need for a germanium photodetector for detecting light in a silicon waveguide with high quantum efficiency and a minimal amount of dark current, and methods of manufacturing the same.

Specifically, there exists a need for a germanium photodetector that minimizes introduction of a germanium material into a silicon waveguide as well as minimizing crystalline defects in the germanium material of the photodetector, and methods of manufacturing the same.

SUMMARY OF THE INVENTION

The present invention provides a germanium photodetector that is evanescently coupled to a silicon waveguide and does not abut the silicon waveguide.

In the present invention, a vertical stack of a first silicon germanium alloy layer, a second epitaxial silicon layer, a second silicon germanium layer, and a germanium layer are formed epitaxially on a top surface of a first epitaxial silicon layer. A dielectric cap layer is deposited on the germanium layer. The vertical stack and the dielectric cap layer are lithographically patterned into a shape of a channel having long parallel edges. After forming a horizontal p-n junction in the germanium layer, the stack of the dielectric cap layer, the germanium layer, the second silicon germanium layer, and the second silicon layer are lithographically patterned in the shape of a photodetector, which may have a tapered protrusion along the direction of the channel.

A dielectric spacer is formed on the sidewalls of the second silicon layer, the second silicon germanium layer, and the germanium layer. The dielectric spacer, the dielectric cap layer, and the silicon germanium layer encapsulate the photodetector. After removing the exposed portions of the second silicon germanium layer, the second silicon germanium layer is undercut from beneath the second silicon layer to form a silicon germanium mesa structure that structurally support an overhanging structure comprising a stack of a silicon portion, a silicon germanium alloy portion, a germanium photodetector, and a dielectric cap portion. The remaining portion of the first silicon layer is a silicon waveguide. The germanium photodetector is suspended by the silicon germanium mesa structure and overlies a cavity, which may be filled with a dielectric material layer or may be maintained as a cavity.

According to an aspect of the present invention, a semiconductor structure is provided, which comprises:

a dielectric layer located on a substrate;

a silicon waveguide located on the dielectric layer and including a portion having a constant width and a constant height;

a silicon germanium mesa structure abutting an upper surface of the silicon waveguide; and a germanium photodetector located above the silicon germanium mesa structure and not abutting the silicon waveguide.

According to another aspect of the present invention, a method of forming a semiconductor structure is provided, which comprises:

forming a vertical stack including, from bottom to top, a first silicon layer, a silicon germanium layer, a second silicon layer, and a germanium layer on a substrate, wherein all of the vertical stack is single crystalline and epitaxially aligned among one another;

patterning the first silicon layer to form a silicon waveguide;

forming a photodetector including a p-n junction in the germanium layer;

forming a dielectric cap portion and a dielectric spacer directly on the photodetector, wherein the dielectric cap portion, the dielectric spacer, and the second silicon layer encapsulates the photodetector; and laterally removing the silicon germanium layer between the first silicon layer and the second silicon layer, wherein a remaining portion of the silicon germanium layer constitutes a silicon germanium mesa structure.

BRIEF DESCRIPTION OF THE DRAWINGS

For all of the figures herein, the following conventions apply. Figures with the same numeric label correspond to the same stage of manufacturing in the same embodiment. Figures with the suffix "A" are top-down views. Figures with the suffix "B" are horizontal cross-sectional views along the plane B-B' in the figures with the same numeric label and suffixes "D," "E," and "F." Figures with the suffix "C" are horizontal cross-sectional views along the plane C-C' in the figures with the same numeric label and suffixes "D," "E," and "F." Figures with the suffix "D," "E," or "F" are vertical cross-sectional views along the plane D-D', E-E', or F-F', respectively, of the corresponding figure with the same numeric label and the suffix FIGS. 1A-7F are various views of a first exemplary semiconductor structure according to a first embodiment of the present invention.

FIGS. 8A-8F are various views of a second exemplary semiconductor structure according to a second embodiment of the present invention. A cavity 97 laterally surrounding a silicon germanium mesa structure 30 is formed in the second exemplary semiconductor structure.

DETAILED DESCRIPTION OF THE INVENTION

As stated above, the present invention relates to a germanium photodetector for a silicon waveguide, and methods of manufacturing the same, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIGS. 1A-1F, a first exemplary semiconductor structure according to a first embodiment of the present invention comprises a semiconductor substrate, which may be a semiconductor-on-insulator (SOI) substrate. The semiconductor substrate includes an insulator layer 10 and a first silicon layer 20L. The semiconductor substrate may further comprise a handle substrate (not shown) located directly beneath the insulator layer 10. In this case, the first silicon layer 20L, the insulator layer 10, and the handle substrate collectively constitute the SOI substrate.

The insulator layer 10 comprises a dielectric material such as silicon oxide, silicon nitride, silicon oxynitride, or a combination thereof. The thickness of the insulator layer 10 may be from about 50 nm to about 10 µm, and typically from about 200 nm to about 1 µm, although lesser and greater thicknesses are also contemplated herein.

The first silicon layer 20L comprises silicon. Preferably, the first silicon layer 20L consists essentially of silicon. The resistivity of the first silicon layer 20L is greater than about 1 Ohm-cm, and preferably greater than about 10 Ohm-cm, and more preferably greater than about 100 Ohm-cm. The first silicon layer 20L may comprise amorphous silicon, polycrystalline silicon, or single crystalline silicon.

Preferably, the first silicon layer 20L comprises a single crystalline silicon, i.e., the entirety of the first silicon layer 20L is single crystalline with epitaxial alignment among all of the silicon atoms therein. Preferably, crystalline defects in the first silicon layer 20L is kept as low as possible. In this case, the refractive index of the first silicon layer 20L in the infrared range may be about 3.45. The absorption constant of the single crystalline silicon in the first silicon layer 20L may be about 3.6 dB/cm, providing excellent light transmission characteristics.

The thickness of the first silicon layer 20L may be from about 50 nm to about 1 µm, and preferably from about 75 nm to about 500 nm, and more preferably from about 100 nm to about 250 nm, although lesser and greater thicknesses are also contemplated herein.

A first silicon germanium layer 30L is epitaxially grown directly on the top surface of the first silicon layer 20L. In case the first silicon layer 20L is single crystalline, the first silicon germanium layer 30L is also single crystalline, and is epitaxially aligned to the first silicon layer 20L. The first silicon germanium layer 30L comprises a silicon germanium alloy.

In one case, the atomic concentration of the silicon germanium layer 30 may be substantially constant. In another case, the composition of the first silicon germanium layer 30L may be vertically graded. The atomic concentration of germanium may increase or decrease with distance from the interface between the first silicon layer 20L and the first silicon germanium layer 30L. In general, the first silicon germanium layer 30L may include a portion having a constant germanium concentration and/or at least another portion in which the atomic concentration of germanium in the first silicon germanium layer 30L varies with the vertical distance from the interface between the first silicon layer 20L and the first silicon germanium layer 30L.

The atomic concentration of germanium in the first silicon germanium layer 30L is non-zero, and may be from about 1% to about 99%, and typically from about 5% to about 50%, although lesser and greater atomic concentrations are also contemplated herein. Preferably, the atomic concentration of germanium in the first silicon germanium layer 30L is selected to enable selective removal of the material of the first silicon germanium layer 30L relative to the silicon material of the first and second silicon layers (20L, 40) by an isotropic etch such as a wet etch. The thickness of the first silicon germanium layer 30L maybe from about 30 nm to about 120 nm, and preferably from 40 nm to about 80 nm, although lesser and greater thicknesses are also contemplated herein.

A second silicon layer 40 is epitaxially grown directly on the top surface of the first silicon germanium layer 30L. In case the first silicon layer 20L is single crystalline, the first silicon germanium layer 30L and the second silicon layer 40 are also single crystalline, and are epitaxially aligned to the first silicon layer 20L. The second silicon layer 40 comprises silicon. Preferably, the second silicon layer 40 consists essentially of silicon. The thickness of the second silicon layer 40 may be from about 10 nm to about 80 nm, and preferably from 15 nm to about 60 nm, although lesser and greater thicknesses are also contemplated herein.

A second silicon germanium layer 50 is epitaxially grown directly on the top surface of the second silicon layer 40. In case the first silicon layer 20L is single crystalline, the first silicon germanium layer 30L, the second silicon layer 40, and the second silicon germanium layer 50 are also single crystalline, and are epitaxially aligned to the first silicon layer 20L. The second silicon germanium layer 50 comprises a silicon germanium alloy. Preferably, the composition of the second silicon germanium layer 50 is vertically graded to reduce defect generation. Specifically, the atomic concentration of germanium may monotonically increase with distance from the interface between the second silicon layer 40 and the second silicon germanium layer 50. The second silicon germanium layer 50 may include a portion having a constant germanium concentration, or the atomic concentration of germanium in the second silicon germanium layer 50 may strictly increase with the vertical distance from the interface between the second silicon layer 40 and the second silicon germanium layer 50.

Preferably, the atomic concentration of germanium in the second silicon germanium layer 50 changes from about 1% near the interface with the second silicon layer 40 to about 99% near the top surface of the second silicon germanium layer 50, although different germanium concentration profiles are also contemplated herein. The thickness of the second silicon germanium layer 50 may be from about 10 nm to about 80 nm, and preferably from 15 nm to about 60 nm, although lesser and greater thicknesses are also contemplated herein.

A germanium layer 60L is epitaxially grown directly on the top surface of the second silicon germanium layer 50. In case the first silicon layer 20L is single crystalline, the first silicon germanium layer 30L, the second silicon layer 40, the second silicon germanium layer 50, and the germanium layer 60L are also single crystalline, and are epitaxially aligned to the first silicon layer 20L. The germanium layer 60L comprises germanium. Preferably, the germanium layer 60L may be deposited with in-situ doping, or may be subsequently doped with dopants, for example, by ion implantation, plasma doping, outdiffusion from a sacrificial dopant containing layer that is subsequently removed, or other equivalent methods. The type of doping in the germanium layer 60L is herein referred to as a first conductivity type doping, which may be a p-type doping or an n-type doping.

After the germanium layer 60L is doped with dopants of the first conductivity type, the germanium layer 60L consists essentially of germanium and dopant atoms of the first conductivity type. In case the first conductivity type is p-type, the dopants may be boron, gallium, indium, or a combination thereof. In case the first conductivity type is n-type, the dopants may be phosphorus, arsenic, antimony, or a combination thereof. The atomic concentration of the dopants of the first conductivity type in the germanium layer 60L may be from about $1.0 \times 10^{16}/cm^3$ to about $2.0 \times 10^{21}/cm^3$, and typically from about $1.0 \times 10^{18}/cm^3$ to about $5.0 \times 10^{20}/cm^3$, although lesser and greater dopant concentrations are also contemplated herein.

The thickness of the germanium layer 60 may be from about 50 nm to about 300 nm, and preferably from 100 nm to about 150 nm, although lesser and greater thicknesses are also contemplated herein.

A dielectric cap layer 70 is deposited directly on the top surface of the germanium layer 60L. The dielectric cap layer 70 comprises a dielectric material such as silicon nitride, silicon oxide, silicon oxynitride, or a combination thereof. The thickness of the dielectric cap layer 70 may be from about 5 nm to about 200 nm, and typically from about 20 nm to about 100 nm, although lesser and greater thicknesses are also contemplated herein. The dielectric cap layer 70 may be formed by low pressure chemical vapor deposition (LPCVD), plasma enhanced chemical vapor deposition (PECVD), high density plasma chemical vapor deposition (HDPCVD), atomic layer deposition (ALD), etc.

Referring to FIGS. 2A-2F, a first photoresist 73 is applied overt the top surface of the dielectric cap layer 70. The first photoresist 73 is lithographically patterned in the shape of a line structure having two parallel edges. The width w of the pattern in the first photoresist 73, which is the distance between the two parallel edges, may be from about 150 nm to about 1.5 µm, and preferably from about 200 nm to about 1.0 µm, and more preferably from 300 nm to about 700 nm, although lesser and greater widths w are also contemplated herein.

The pattern in the first photoresist 73 is transferred into the vertical stack, from bottom to top, of the first silicon layer 20L, the first silicon germanium layer 30L, the second silicon layer 40, the second silicon germanium layer 50, the germanium layer 60L, and the dielectric cap layer 70 by an anisotropic etch, which may be a reactive ion etch. The first photoresist 73 is employed as an etch mask. The sidewalls of the various layers are substantially vertically coincident in the remaining portion of the vertical stack (20L, 30L, 40, 50, 60L, 70) after the anisotropic etch, which has a constant width, i.e., the width w of the pattern of the first photoresist 73, throughout.

Referring to FIGS. 3A-3F, a second photoresist 75 is applied over the vertical stack of the first silicon layer 20L, the first silicon germanium layer 30L, the second silicon layer 40, the second silicon germanium layer 50, the germanium layer 60L, and the dielectric cap layer 70. The second photoresist 75 is lithographically patterned to cover a portion of the vertical stack (20L, 30L, 40, 50, 60L, 70), while exposing another portion of the vertical stack (20L, 30L, 40, 50, 60L, 70). For example, an edge of the second photoresist 75 may run across the entirety of the top surface of the dielectric cap layer 70 at right angle from the direction of the parallel edges of the vertical stack (20L, 30L, 40, 50, 60L, 70) separated by the width w.

Dopants of a second conductivity type are implanted into an upper portion of the germanium layer 60L which has a doping of the first conductivity type. The second conductivity type is the opposite of the first conductivity type. For example, if the first conductivity type is p-type, the second conductivity type is n-type, and vice versa. The dose of the ion implantation is selected so that the concentration of the second conductivity dopants in the implanted region exceeds the concentration of the first conductivity dopants. Thus, a second-conductivity-type germanium region 62 having a net doping of the second conductivity type is formed in an upper portion of the germanium layer in the exposed area, i.e., in the area not covered by the second photoresist 75. The net doping concentration, i.e., the concentration of the second conductivity dopants less the concentration of the first conductivity dopants, in the second-conductivity-type germanium region 62 may be from about $1.0 \times 10^{16}/cm^3$ to about $2.0 \times 10^{21}/cm^3$, and typically from about $1.0 \times 10^{18}/cm^3$ to about $5.0 \times 10^{20}/cm^3$, although lesser and greater dopant concentrations are also contemplated herein.

The energy and species of the dopants of the second conductivity type that are implanted into the second-conductivity-type germanium region 62 is selected so that the bottom surface of the second-conductivity-type germanium region 62 is formed between the top surface and the bottom surface of the germanium layer 60L. The remaining portions of the germanium layer 60L underneath the second-conductivity-type germanium region 62 or underneath the second photoresist 75 has the same doping as before the ion implantation of the second conductivity dopants, and are herein collectively referred to as a first-conductivity-type germanium region 60. One of the first-conductivity-type germanium region 60 and the second-conductivity-type germanium region 62 is a p-doped germanium portion, and the other of the first-conductivity-type germanium region 60 and the second-conductivity-type germanium region 62 is an n-doped germanium portion.

A p-n junction is formed at the interface between the first-conductivity-type germanium region 60 and the second-conductivity-type germanium region 62. Thus, the first-conductivity-type germanium region 60 and the second-conductivity-type germanium region 62 collectively function as a photodetector. The first-conductivity-type germanium region 60 and the second-conductivity-type germanium region 62 are collectively referred to as a germanium photodetector (60, 62). The p-n junction may include a substantially horizontal interface between the first-conductivity-type germanium region 60 and the second-conductivity-type germanium region 62. Depletion regions are formed on both sides of the p-n junction. Preferably, horizontal surfaces of the depletion regions do not abut the top surface of the second-conductivity-type germanium region 62 or the bottom surface of the first-conductivity-type germanium region 60. The second photoresist 75 is subsequently removed.

Referring to FIGS. 4A-4F, a third photoresist 77 is applied over the first exemplary semiconductor structure and is lithographically patterned to form a shape having at least two different widths in the direction perpendicular to the sidewalls of the first silicon layer 20L. The third photoresist 77 as patterned covers a portion of the vertical stack of the of the first silicon layer 20L, the first silicon germanium layer 30L, the second silicon layer 40, the second silicon germanium layer 50, the germanium detector (60, 62), and the dielectric cap layer 70, and may cover adjoining portions of the insulator layer 10. Preferably, the pattern in the third photoresist 77 includes a tapered portion having a monotonically decreasing width along the direction of the sidewalls of the first silicon layer 20L. The pattern in the third photoresist 77 is transferred into the stack, from top to bottom, of the dielectric cap layer 70, the germanium photodetector (60, 62) which is a germanium layer, the second silicon germanium layer 50, and the second silicon layer 40 by an anisotropic etch, which may be a reactive ion etch. The anisotropic etch stops on the top surface of the first silicon germanium layer 30L or in the middle of the first silicon germanium layer 30L. The anisotropic etch may be selective to the material of the first silicon germanium layer 30L. Not necessarily but preferably, the anisotropic etch is also selective to the material of the insulator layer 10.

All layers in the patterned stack of the second silicon layer 40, the second silicon germanium layer 50, the germanium detector (60, 62), and the dielectric cap layer 70 have substantially vertically coincident sidewalls. The patterned stack (40, 50, 60, 62, 70) may include a constant width portion, which has the same width as the first silicon layer 20L, and a tapered portion that has a monotonically decreasing width with distance from the constant width portion in a direction parallel to the sidewalls of the first silicon layer 20L. The tapered portion may have a strictly decreasing width with distance from the constant width portion of the patterned stack (40, 50, 60, 62, 70).

As used herein, a monotonic decrease in width with distance denotes that the a first width at a first distance is not more than a second width at a second distance if the first distance is greater than the second distance for any pair of the first and second distances. As used herein, a strict decrease in width with distance denotes that a first width at a first distance is less than a second width at a second distance if the first distance is greater than the second distance for any pair of the first and second distances. In one example, the tapered portion may have a constant taper, i.e., the rate of decrease in the width of the tapered portion with the distance is constant throughout the tapered portion. In another example, the width of the tapered portion may become zero at a distal end of the tapered portion, i.e., the cross-sectional area of the tapered portion may have a pointed end. The third photoresist 77 is subsequently removed.

Figure 1A:
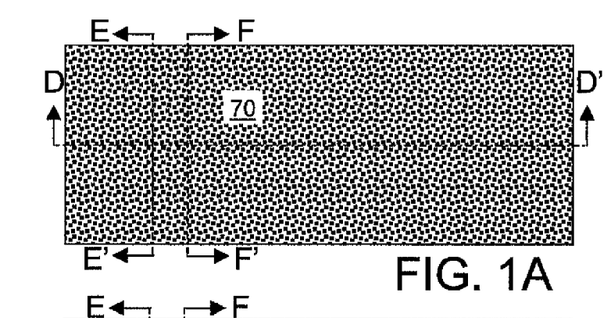
FIGS. 1A-1F correspond to the step after formation of a vertical stack of a first silicon germanium layer 30L, a second silicon layer 40, a second silicon germanium layer 50, a germanium layer 60L, and a dielectric cap layer 70 on a first silicon layer 20L on a substrate.
Figures 1B, 1C:
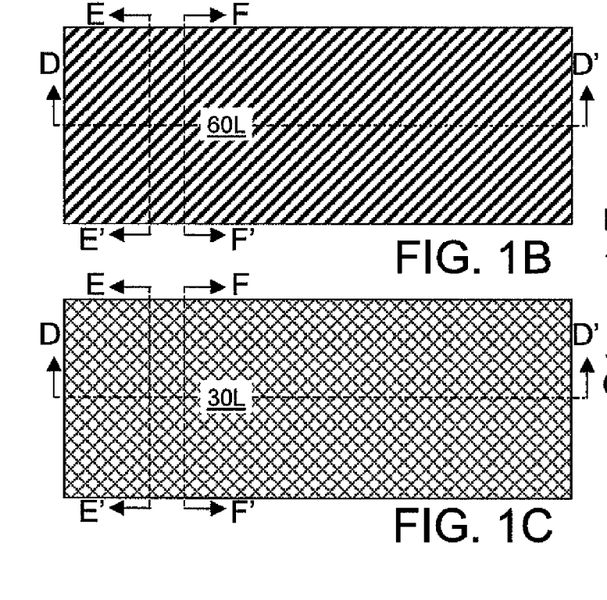
Figure 1D:
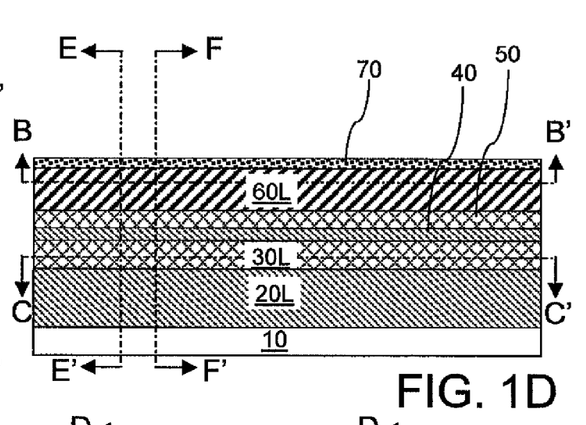
Figure 1E:
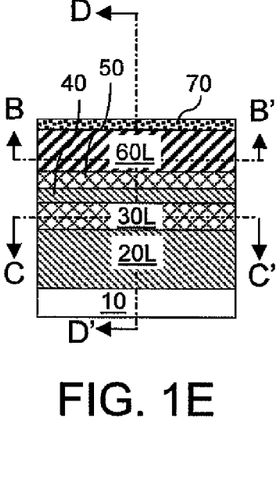
Figure 1F:
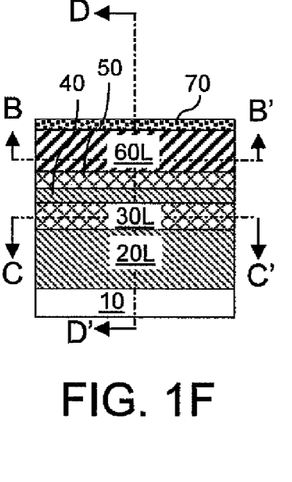
Figure 2A:
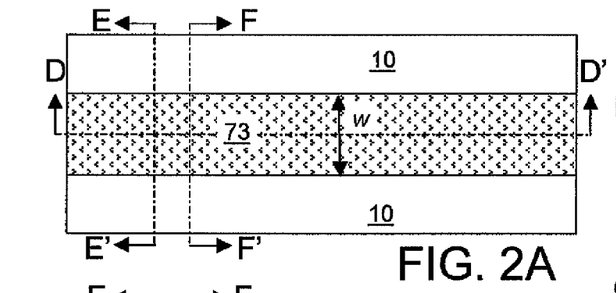
FIGS. 2A-2F correspond to the step after lithographic patterning of the vertical stack of the first silicon layer 20L, the first silicon germanium layer 30L, the second silicon layer 40, the second silicon germanium layer 50, the germanium layer 60L, and the dielectric cap layer 70 into a shape having substantially parallel sidewalls.
Figure 2B:
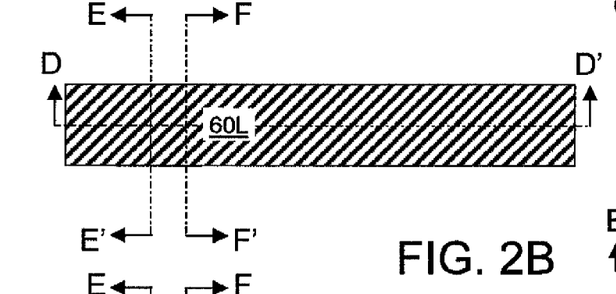
Figure 2C:
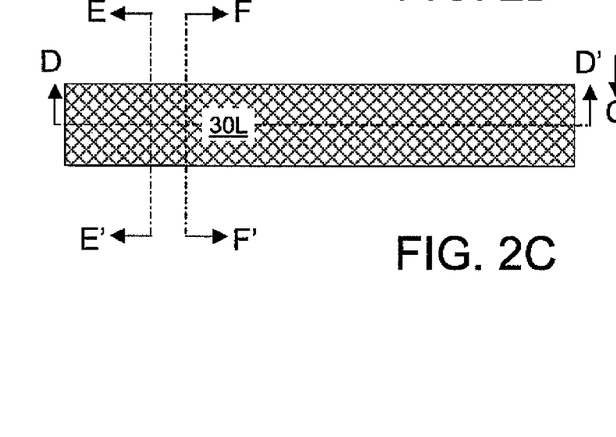
Figure 2D:
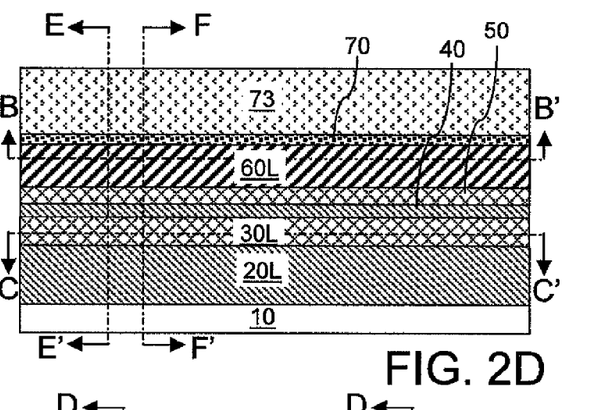
Figure 2E:
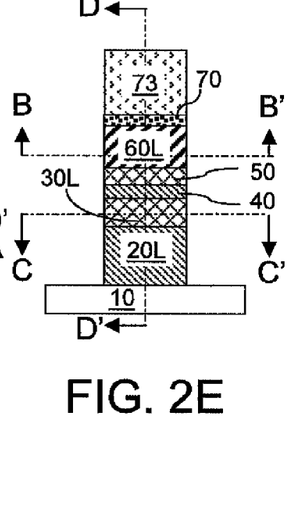
Figure 2F:
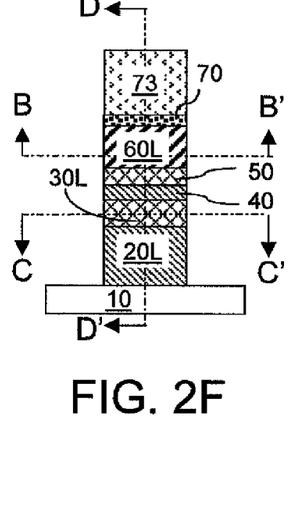
Figures 3A, 3B, 3C:
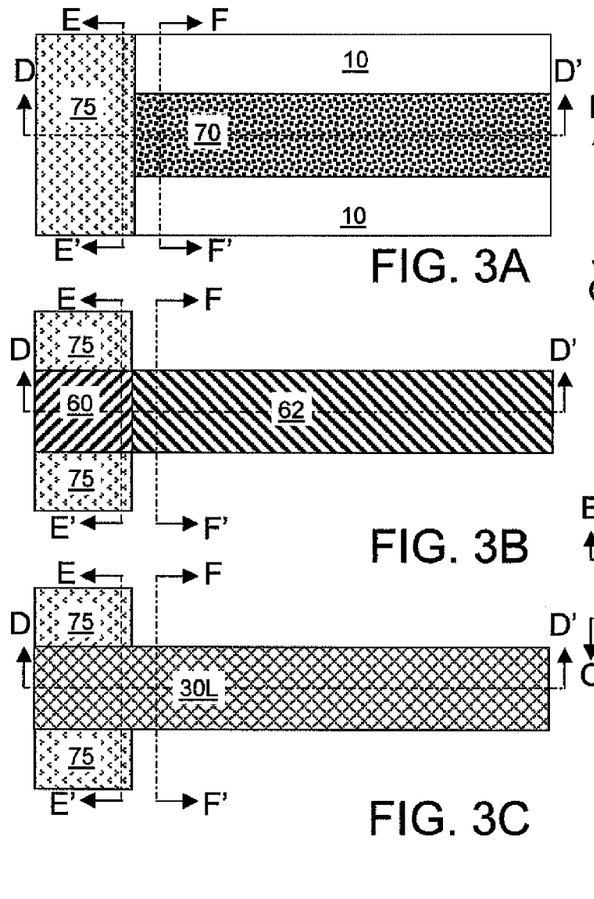
FIGS. 3A-3F correspond to the step after formation of a first conductivity type germanium portion 60 and a second conductivity type germanium portion 62.
Figure 3D:
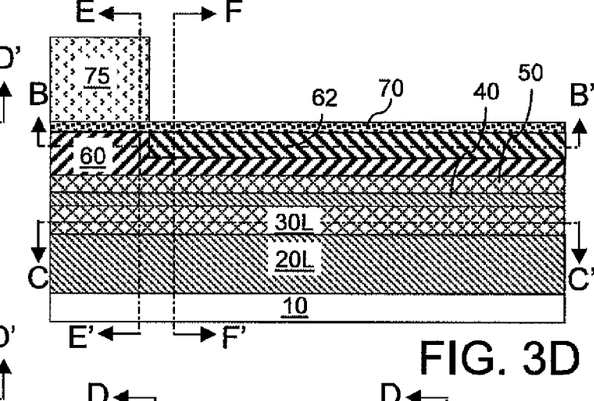
Figure 3E:
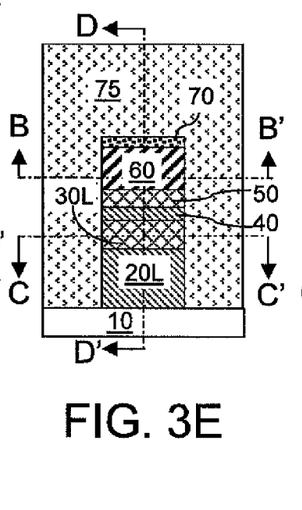
Figure 3F:
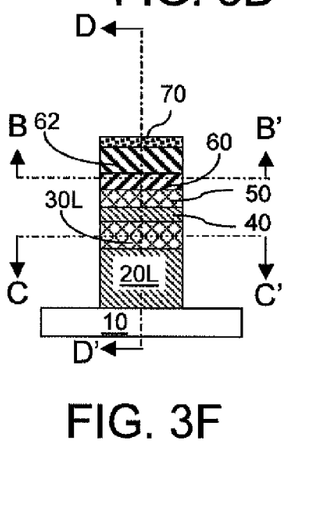
Figure 4A:
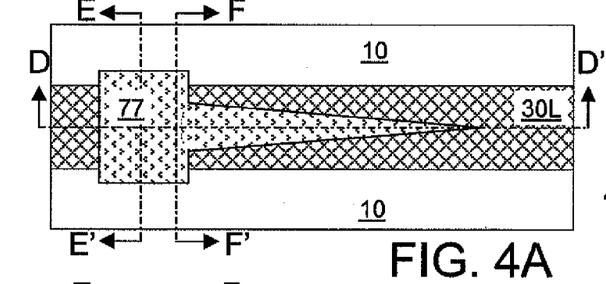
FIGS. 4A-4F correspond to the step after patterning of the vertical stack of the first silicon germanium layer 30L, the first silicon layer 40, the second silicon germanium layer 50, the germanium layer 60, and the dielectric cap layer 70 into a shape having a taper in the direction parallel to the sidewalls of the first semiconductor layer 20L.
Figure 4B:
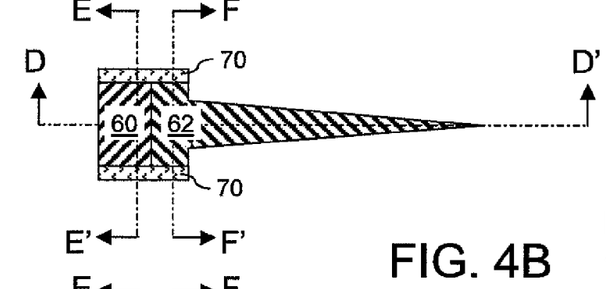
Figure 4C:
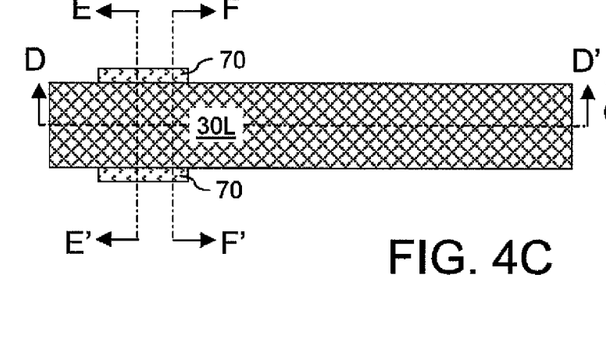
Figure 4D:
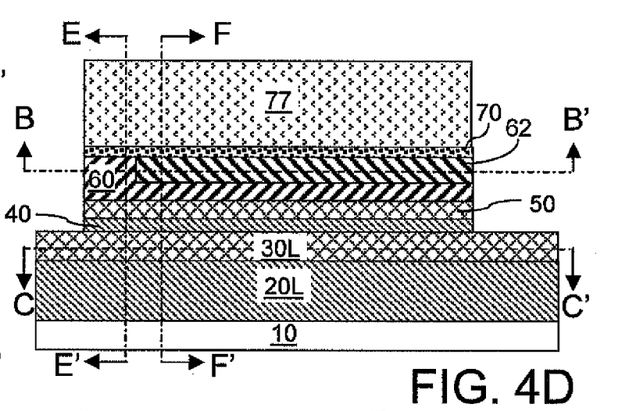
Figure 4E:
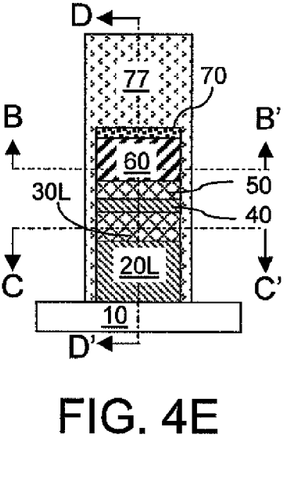
Figure 4F:
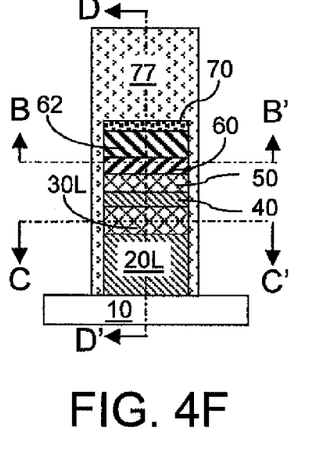
Figure 5A:
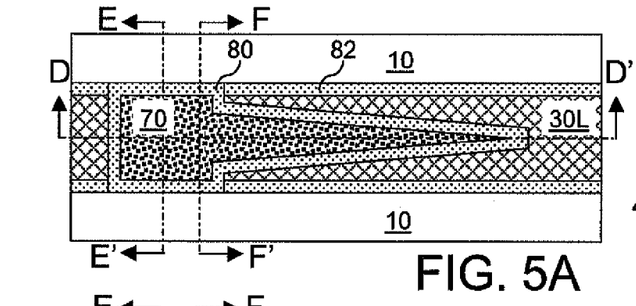
FIGS. 5A-5F correspond to the step after formation of a dielectric spacer 80 on the sidewalls of the second silicon layer 40, the second silicon germanium layer 50, the first-conductivity-type germanium portion 60, and the second-conductivity-type germanium portion 62.
Figure 5B:
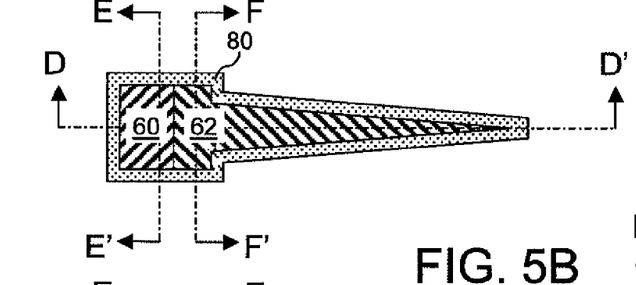
Figure 5C:
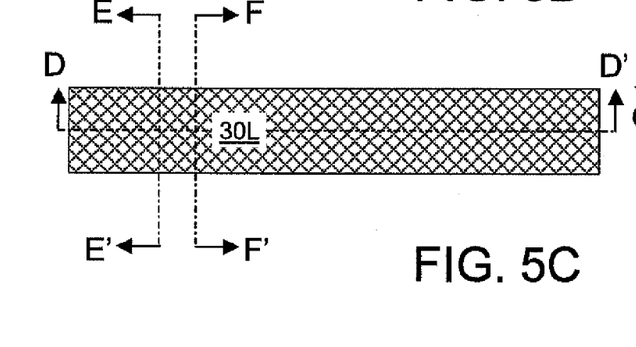
Figure 5D:
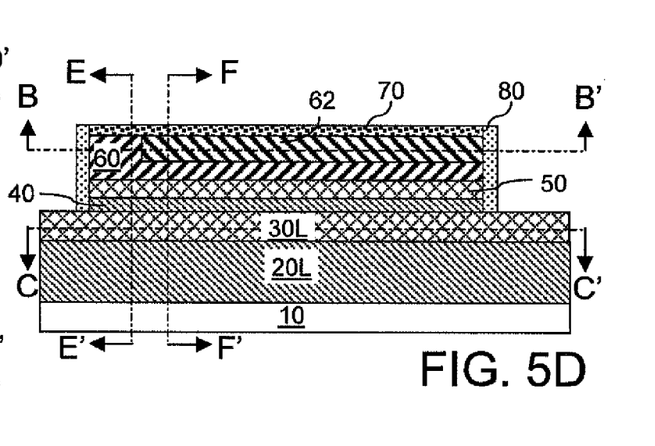
Figure 5E:
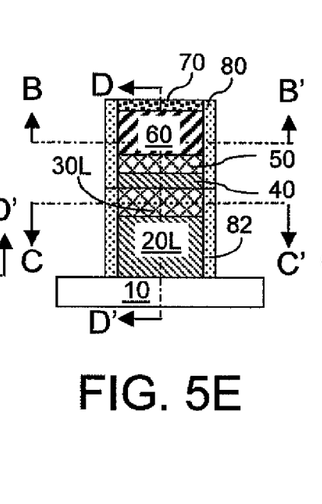
Figure 5F:
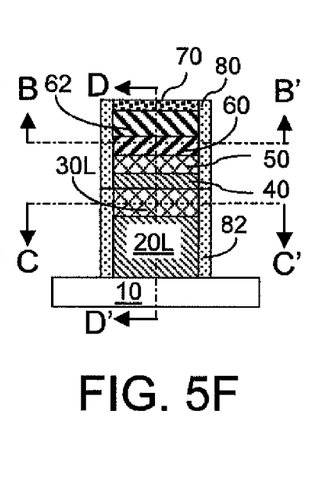
Figure 6A:
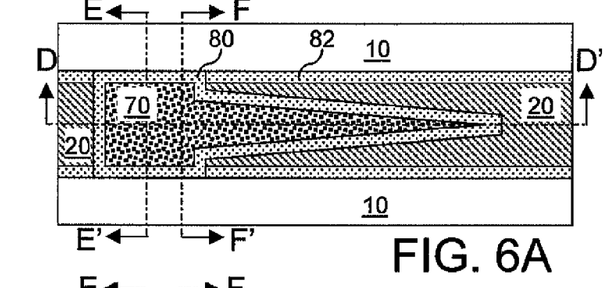
FIGS. 6A-6F correspond to the step after removal of portions of the first silicon germanium layer 30L to form a silicon germanium mesa structure 30.
Figure 6B:
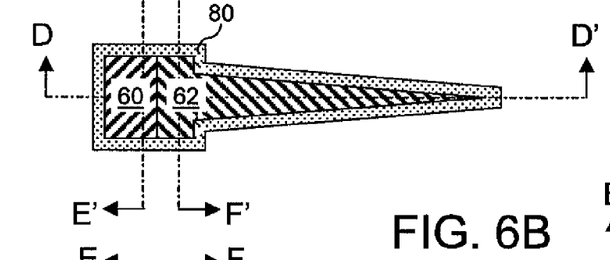
Figure 6C:
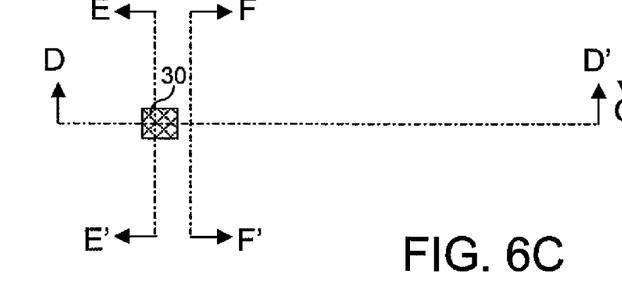
Figure 6D:
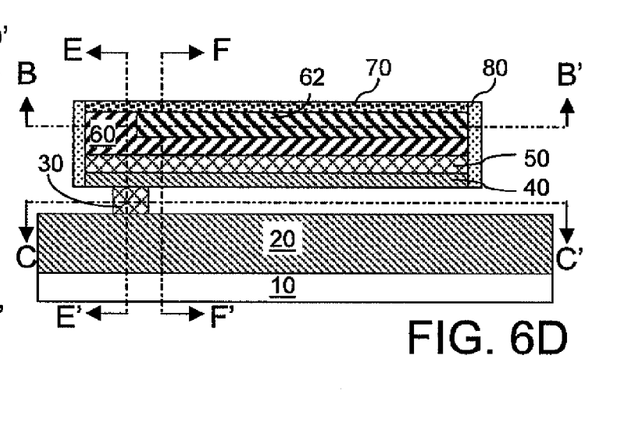
Figure 6E:
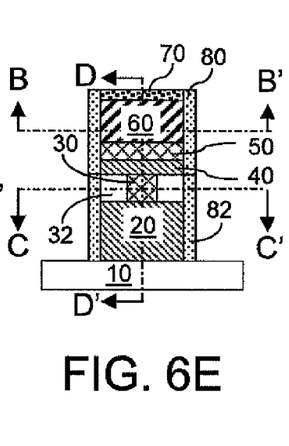
Figure 6F:
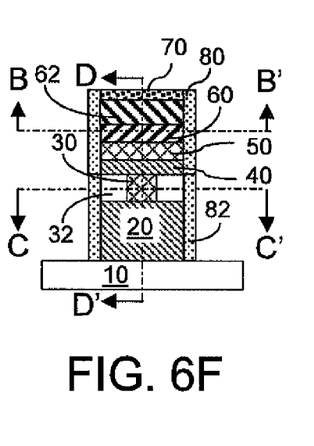
Figure 7A:
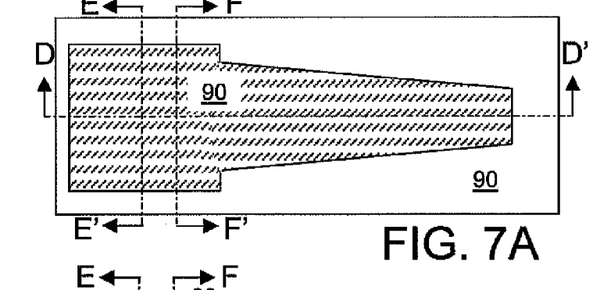
FIGS. 7A-7F correspond to the step after formation of a first dielectric material layer 90, a second dielectric material layer 92, at least one first contact via 94, and at least one second contact via 96.
Figure 7B:
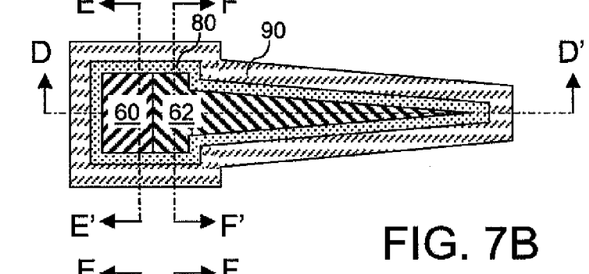
Figure 7C:
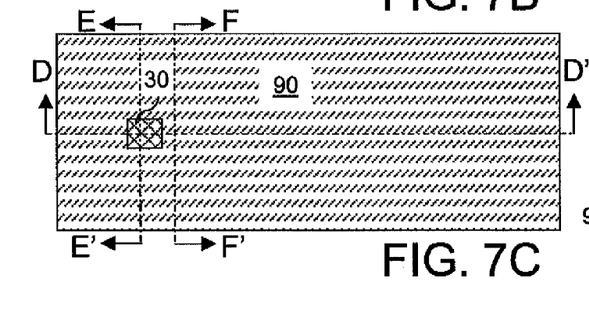
Figure 7D:
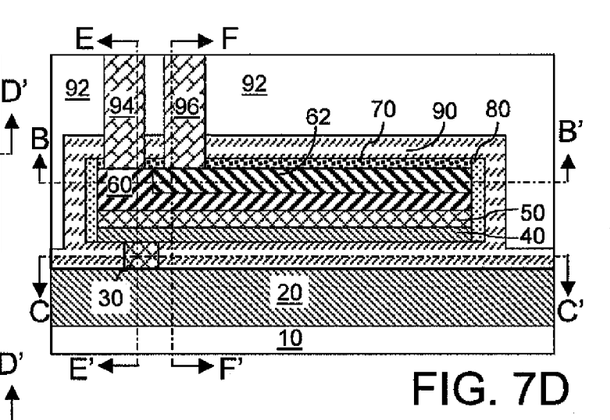
Figure 7E:
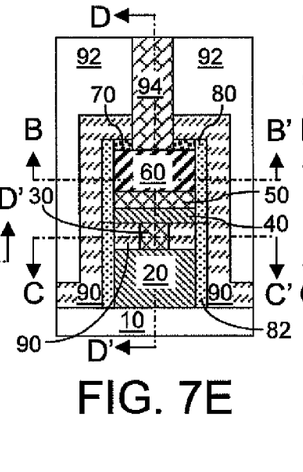
Figure 7F:
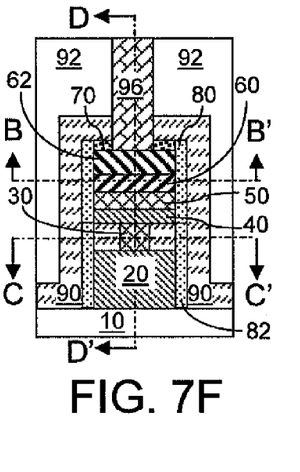
Figure 8A:
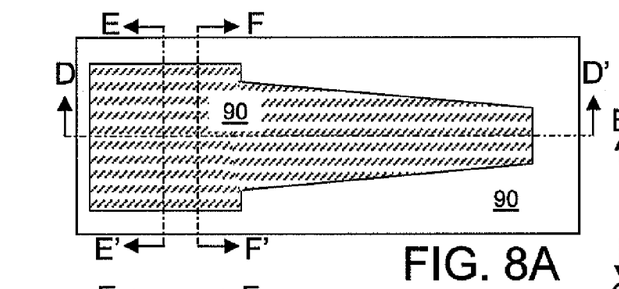
Figure 8B:
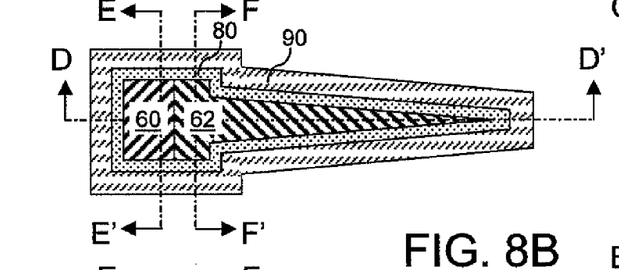
Figure 8D:
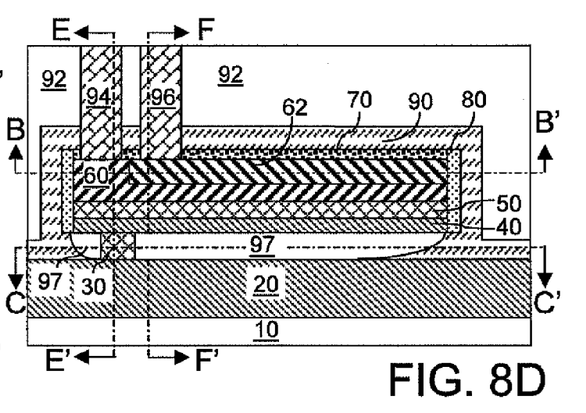
Figure 8E:
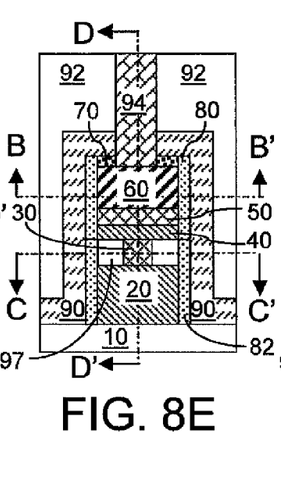
Figure 8F:
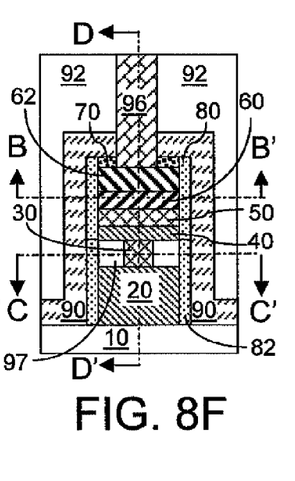

Referring to FIGS. 5A-5C, dielectric spacers are formed on the sidewalls of the first exemplary semiconductor structure, which include sidewalls of the first silicon layer 20L and the first silicon germanium layer 30L and sidewalls of the patterned stack (40, 50, 60, 62, 70) that include, from bottom to top, the second silicon layer 40, the second silicon germanium layer 50, the germanium detector (60, 62), and the dielectric cap layer 70. The dielectric spacers are formed by deposition of a conformal dielectric material layer, followed by an anisotropic etch that removes horizontal portion of the conformal dielectric material layer. The vertical portions of the conformal dielectric material layer that remains on the sidewalls of the patterned stack (40, 50, 60, 62, 70) after the anisotropic etch constitutes a first dielectric spacer 80, and the vertical portions of the conformal dielectric material layer that remains on the sidewalls of the first silicon layer 20L and the first silicon germanium layer 30L after the anisotropic etch constitutes a second dielectric spacer 82. In case the constant thickness portion of the patterned stack (40, 50, 60, 62, 70) have a width comparable to the width of the first silicon layer 20L, the first dielectric spacer 80 and the second dielectric spacer 82 may be of unitary and integral construction, i.e., formed as a single contiguous structure without any interface therebetween.

The first dielectric spacer 80 and the second dielectric spacer 82 comprise a dielectric material such as silicon nitride, silicon oxide, silicon oxynitride, or a combination thereof The dielectric material has a lower refractive index than the refractive index of silicon, which is about 3.45. For example, silicon oxide has a refractive index of about 1.45, and silicon nitride has a refractive index of about 2.05. By insuring that the refractive index of the second dielectric spacer 82 is less than the refractive index of silicon, light may be confined in a silicon waveguide which is derived from the first silicon layer 20L by total reflection at the walls of the silicon waveguide. The lateral thickness of the first dielectric spacer 80 and the second dielectric spacer 82 may be from about 5 nm to about 200 nm, and preferably from about 20 nm to about 100 nm, although lesser and greater thicknesses are also contemplated herein.

The first dielectric spacer 80 laterally abuts and laterally surrounds a portion (50, 60, 62) of the patterned stack (40, 50, 60, 62, 70). This portion (50, 60, 62) of the patterned stack (40, 50, 60, 62, 70) is vertically bound by the dielectric cap layer 70 at the top and the second silicon layer 40 at the bottom. The second silicon germanium layer 50 and the germanium photodetector (60, 62), which is a germanium layer, are encapsulated by the dielectric cap layer 70, the first dielectric spacer 80, and the second silicon layer 40. Particularly, the germanium photodetector (60, 62) is encapsulated by the dielectric cap layer 70, the first dielectric spacer 80, and the second silicon germanium layer 50. The second silicon germanium layer 50 is encapsulated by the germanium photodetector (60, 62), the first dielectric spacer 80, and the second silicon layer 40.

Referring to FIGS. 6A-6F, the exposed portions of the first silicon germanium layer 30L are removed by an isotropic etch, which may be a wet etch. For example, a wet etch chemistry that contains ammonium hydroxide ($NH_4OH$) and hydrogen peroxide ($H_2O_2$) may be employed to remove the silicon germanium alloy in the first silicon germanium layer 30L. The higher the germanium concentration in the first silicon germanium layer 30L, the more effective this etch chemistry is in removing the material of the first silicon germanium layer 30L. Further, the etch is extended to induce removal of the material of the first silicon germanium layer 30L between the first silicon layer 20L and the second silicon layer 40. Thus, the material of the first silicon germanium layer 30L is laterally undercut inward from the peripheral surfaces that coincide with the sidewalls of the patterned stack (40, 50, 60, 62, 70).

The lateral undercut of the first silicon germanium layer 30L is stopped before the entirety of the material in the first silicon germanium layer 30L is removed by the isotropic etch. A portion of the first silicon germanium layer 30L remains underneath the region of the constant thickness portion, or a portion having the greatest width, in the patterned stack (40, 50, 60, 62, 70). The remaining portion of the first silicon germanium layer 30L is herein referred to as a silicon germanium mesa structure 30. The width of the silicon germanium mesa structure is less than the width of the first silicon layer 20L. Preferably, the material of the first silicon germanium layer 30L is removed from underneath the tapered portion of the patterned stack (40, 50, 60, 62, 70).

The material of the first silicon germanium layer 30L is removed from the top surface of the first silicon layer 20L outside the area that underlies the constant thickness portion of the patterned stack (40, 50, 60, 62, 70). The first silicon layer 20L may be employed as an effective silicon waveguide that transmits light without any significant signal loss at this point. Therefore, the first silicon layer 20L is also referred to as a silicon waveguide 20 hereafter.

In case the first dielectric spacer 80 and the second dielectric spacer 82 may be of unitary and integral construction, two tunnel cavities may be formed between the silicon waveguide 20 and the second silicon layer 40 and between the silicon germanium mesa structure 30 and the second dielectric spacer 82. The patterned stack (40, 50, 60, 62, 70) hangs over the silicon waveguide 20. The patterned stack (40, 50, 60, 62, 70) including the germanium detector (60, 62) overlies the entirety of the silicon germanium mesa structure 30, and a portion of the germanium detector (60, 62) does not overlie the silicon germanium mesa structure 30. As seen in a see-through top-down view, the periphery of the silicon germanium mesa structure 30 is entirely contained within the periphery of the germanium detector (60, 62).

Referring to FIGS. 7A-7F, a first dielectric material layer 90 and a second dielectric material layer 92 are formed on the first exemplary semiconductor structure. For example, the material of the first dielectric material layer 90 may be formed by conformal deposition, and may fill the entirety of the gap between the silicon waveguide 20 and the second silicon layer 40. Further, the first dielectric layer covers the entirety of the exposed surfaces of the first and second dielectric spacers (80, 82) and the dielectric cap layer 70. The thickness of the first dielectric material layer 90 is greater than the thickness, or the height, of the silicon germanium mesa structure to enable the filling of the gap between the silicon waveguide 20 and the second silicon layer 40.

The dielectric materials that may be used for the first dielectric material layer 90 and the second dielectric material layer 92 include, but are not limited to, a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0. The dielectric material may non-porous or porous. The dielectric material for the first dielectric material layer 90 has a lower refractive index than silicon.

At least one contact via 94 that vertically abuts the first-conductivity-type germanium region 60 and at least another contact via 96 that vertically abuts the second-conductivity-type germanium region 62 are formed through the first dielectric material layer 90 and the second dielectric material layer 92. The at least one contact via 94 and the at least another contact via 96 comprise a conductive material such as W, Cu, Al, TaN, TiN, Ta, Ti, or a combination thereof.

Referring to FIGS. 8A-8F, a second exemplary semiconductor structure according to a second embodiment of the present invention is derived from the first exemplary semiconductor structure of FIGS. 6A-6F. In the second embodiment, the first dielectric material layer 90 is formed by a non-conformal deposition method. The gap between the silicon waveguide 20 and the second silicon layer 40 is not completely filled. Due to the non-conformal nature of the deposition process, the patterned stack (40, 50, 60, 62, 70) prevents deposition of the material of the first dielectric material layer 90 at least in portions of the gap between the silicon waveguide 20 and the second silicon layer 40. The unfilled gap becomes a cavity 97, which laterally surrounds the silicon germanium mesa structure 97. The topological structure of the cavity 97 may be the same as the topological structure of a torus, i.e., the cavity 97 may be topologically homeomorphic to a torus so that the shape of the cavity 97 may be transformed into the shape of a torus without forming or destroying a topological singularity, i.e., a new hole in the shape.

The first exemplary semiconductor structure of FIGS. 7A-7F or the second exemplary semiconductor structure of FIGS. 8A-8F may be employed as a combination of a silicon waveguide 20 and a germanium photodetector (60, 62). The germanium detector (60, 62) is not located directly on the silicon waveguide 20. However, evanescent coupling, which is a quantum effect due to the quantum electrodynamic property of light, enables coupling and detection of light in the silicon waveguide 20 by the germanium photodetector (60, 62).

The light may have a wavelength from about 400 nm to about 1,700 nm in vacuum, and have a wavelength that is shortened by a factor that is the same as the refractive index of silicon, i.e., by a factor of about 3.45, in the silicon waveguide. Because the material outside the silicon waveguide 20 has a lower refractive index than silicon, total reflection occurs within the waveguide 20 so that the loss of light along the direction of the silicon waveguide is solely due to absorption of the light. Since the absorption coefficient of silicon is about 3.6 dB/cm in single crystalline silicon, the light is transmitted through the silicon waveguide 20 with little loss in intensity.

The photodetector (60, 62) coupled with light that travels along the silicon waveguide 20 by optically coupling with evanescent portion of the light wave. Although the light is nominally "confined" within the silicon waveguide 20, the wave property of light causes the wavefunction of the light to extend outside the silicon waveguide 20. The evanescent portion of the wavefunction of the light decays exponentially outside the silicon waveguide 20 with the distance from the sidewalls of the silicon waveguide 20. The effective range of the evanescent portion of the wavefunction may be from about 150 nm to about 600 nm, depending on the wavelength of the light and the dimensions of the silicon waveguide 20. Once the light couples with the photodetector (60, 62), the energy of the light is absorbed by the photodetector (60, 62) as a light particle.

Upon interaction with light, the photodetector (60, 62) generates electron-hole pairs as a photodiode. Charge carriers of the second conductivity type are collected in the second-conductivity-type germanium region 62 in proportion to the amount of photons that interact with the photodetector (60, 62). In case the first conductivity type is p-type and the second conductivity type is n-type, electrons are collected in the second-conductivity-type germanium region 62. In case the second conductivity type is n-type and the second conductivity type is p-type, holes are collected in the second-conductivity-type germanium region 62.

If the electron-hole pair is generated within the depletion region of the photodetector (60, 62), which extends into a portion of the second-conductivity-type germanium region 62 and a portion of the first-conductivity-type germanium region 60 from the p-n junction, the charge carriers (holes and electrons) drift apart due to the kinetic energy imparted to the charge carriers during the photogeneration process. If a minority carrier (a charge carrier of the first conductivity type in the second-conductivity-type germanium region 62 or a charge carrier of the second conductivity type in the first-conductivity-type germanium region 60) enters into the depletion region by drifting, the electric field inherent in the depletion region of the photodetector (60, 62) sweeps the carrier across the p-n junction, which then becomes a majority carrier, i.e., a charge carrier of the first conductivity type in the first-conductivity-type germanium region 60 or a charge carrier of the second conductivity type in the second-conductivity-type germanium region 62, upon crossing the p-n junction, and producing a photocurrent if the circuit is closed, or accumulates charges.

The photocurrent flows through the at least one contact via 94 and the at least another contact via 96 to a sensing circuit, which may be formed on the semiconductor substrate which may be formed in another portion of the first silicon layer 20L that is not patterned into a silicon waveguide 20. The presence of current through the sensing circuit signifies presence of the light signal in the silicon waveguide 20, and the absence of current through the sensing circuit signifies the absence of any light signal in the silicon waveguide 20. Thus, an optical signal is converted to an electrical signal by the germanium photodetector (60, 62).

The tapered portion of the photodetector (60, 62) maximizes the coupling of the photodetector (60, 62) with the evanescent portion of the light by gradually changing the effective refractive index of the region permeated by the evanescent portion of the light. Preferably, the length of the tapered portion of the photodetector (60, 62) is at least as long as the wavelength of the light, and is preferably at least several times greater than the wavelength of the light in the silicon waveguide 20. For example, the length of the tapered portion of the photodetector (60, 62) may be from about 1 μm to about 30 μm, and preferably from about 3 μm to about 10 μm, although lesser and greater lengths are also contemplated herein.

The combination of the silicon waveguide 20 and the germanium photodetector (60, 62), as shown in FIGS. 7A-7F and 8A-8F, provide superior performance over prior art structures in many aspects. First, the contact area between the silicon germanium mesa structure 30 and the silicon waveguide 20 may be much less than the planar area of the germanium photodetector (60, 62). Since the silicon waveguide 20 makes less areal contact with a germanium-containing material, less germanium diffuses into the silicon waveguide 20, thereby keeping the material of the silicon waveguide 20 pure with less impurities, and thereby reducing loss of the light signal either by reflection or absorption.

Second, the crystalline defect density in the silicon germanium mesa structure 30 and the patterned stack (40, 50, 60, 62, 70) including the germanium photodetector (60, 62) may be decreased since the abrupt compositional transition that is required for prior art germanium detectors that are formed directly on a silicon waveguide is replaced by a gradual compositional change between successive epitaxial layers. Particularly, the second silicon germanium layer 50 allows gradual change of the atomic concentration of germanium, thereby enabling epitaxial growth of a high quality low defect density germanium material in the germanium layer 60L that is employed for the germanium photodetector. Thus, the dark current in the germanium photodetector (60, 62) is reduced with the decrease in the crystalline defect density in the material of the germanium photodetector (60, 62).

Third, the tapered portion of the patterned stack (40, 50, 60, 62, 70) provides a gradual change in the effective refractive index that the evanescent portion of the light in the silicon waveguide detects. For the evanescent portion of the light, the effective refractive index changes from the effective refractive index of the first and second dielectric material layers (990, 92), which may be from about 1.45 to 2.05, to the refractive index of germanium, which is about 4.0. Since the reflection of the light is minimized by the gradual change of the refractive index as seen by the light, the intensity of light impinging on the germanium photodiode (60, 62) increases.

Such advantageous features of the present invention are combined to provide high quantum efficiency for light detection and low dark current to the germanium detector (60, 62) of the present invention.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:
1. A semiconductor structure comprising:
a dielectric layer located on a substrate;
a silicon waveguide located on said dielectric layer and including a portion having a constant width and a constant height;
a silicon germanium mesa structure abutting an upper surface of said silicon waveguide; and a germanium photodetector located above said silicon germanium mesa structure and not abutting said silicon waveguide.

2. The semiconductor structure of claim 1, wherein said germanium photodetector is single crystalline.

3. The semiconductor structure of claim 2, wherein said silicon germanium mesa structure and said silicon waveguide are single crystalline and are epitaxially aligned to said germanium photodetector.

4. The semiconductor structure of claim 1, further comprising a silicon layer vertically abutting a top surface of said silicon germanium mesa structure and underlying said germanium photodetector.

5. The semiconductor structure of claim 4, wherein said germanium photodetector overlies an entirety of said silicon germanium mesa structure, and a portion of said germanium photodetector does not overlie said silicon germanium mesa structure.

6. The semiconductor structure of claim 1, wherein said germanium photodetector comprises a p-doped germanium portion and an n-doped germanium portion with a p-n junction therebetween.

7. The semiconductor structure of claim 6, further comprising
a dielectric cap layer vertically abutting a top surface of said germanium photodetector; and
a dielectric spacer laterally abutting and laterally surrounding said germanium photodetector.

8. The semiconductor structure of claim 7, further comprising at least one first contact via vertically abutting said p-doped germanium portion and at least one second contact via vertically abutting said n-doped germanium portion.

9. The semiconductor structure of claim 8, further comprising a silicon layer vertically abutting a top surface of said silicon germanium mesa structure and underlying said germanium photodetector, wherein said germanium photodetector is encapsulated by said dielectric cap layer, said dielectric spacer, said silicon layer, said at least one first contact via, and said at least one second contact via.

10. The semiconductor structure of claim 9, further comprising a silicon germanium layer vertically abutting a bottom surface of said germanium photodetector and a top surface of said silicon layer, wherein said germanium photodetector is encapsulated by said dielectric cap layer, said dielectric spacer, and said silicon germanium layer, said at least one first contact via, and said at least one second via.

11. The semiconductor structure of claim 1, further comprising a dielectric material layer laterally abutting and laterally surrounding sidewalls of said silicon germanium mesa structure and vertically abutting a top surface of said silicon waveguide and a bottom surface of a silicon layer comprising single crystalline silicon and epitaxially aligned to said silicon waveguide.

12. The semiconductor structure of claim 1, further comprising a cavity laterally abutting and laterally surrounding sidewalls of said silicon germanium mesa structure and vertically abutting a top surface of said silicon waveguide and a bottom surface of a silicon layer comprising single crystalline silicon and epitaxially aligned to said silicon waveguide.

13. The semiconductor structure of claim 1, wherein said germanium photodetector comprises a tapered portion in which a lateral width of said tapered portion monotonically decreases along a lengthwise direction of said silicon waveguide.

* * * * *